United States Patent
Giotta et al.

(10) Patent No.: US 7,834,696 B2
(45) Date of Patent: Nov. 16, 2010

(54) COMMON MODE CONTROL CIRCUITRY FOR MULTI-STAGE OPERATIONAL AMPLIFIERS

(75) Inventors: Dario Giotta, Tarvisio (IT); Richard Gaggl, Poertschach (AT); Ivonne Di Sancarlo, Gallipoli (IT); Andrea Baschirotto, Tortona (IT)

(73) Assignee: Infineon Technologies AG, Neubiberg (DE)

( * ) Notice: Subject to any disclaimer, the term of this patent is extended or adjusted under 35 U.S.C. 154(b) by 107 days.

(21) Appl. No.: 12/062,539

(22) Filed: Apr. 4, 2008

(65) Prior Publication Data

US 2009/0251216 A1    Oct. 8, 2009

(51) Int. Cl.
*H03F 3/45* (2006.01)

(52) U.S. Cl. ..................... 330/258; 330/259

(58) Field of Classification Search ............... 330/253, 330/258, 259, 260
See application file for complete search history.

(56) References Cited

U.S. PATENT DOCUMENTS 6,577,185 B1 * 6/2003 Chandler et al. ............ 330/258
7,071,780 B2 * 7/2006 Van Zanten ................ 330/258

OTHER PUBLICATIONS

X. Fan et. al:, Single Miller Capacitor Frequency Compensation Technique for Low-Power Multistage Amplifiers, IEEE Journal Solid-State Circuits, vol. 40, No. 3, Mar. 2005, pp. No. 584-592.
D. Johns et. al.: Common-Mode Feedback Circuits; chapter 6, pp. No. 287-291, John Wiley & Sons, Inc., 1997.

* cited by examiner

*Primary Examiner*—Khanh V Nguyen
(74) *Attorney, Agent, or Firm*—SpryIP, LLC

(57) ABSTRACT

This disclosure relates to a common mode regulation in multi stage differential amplifiers.

11 Claims, 4 Drawing Sheets

COMMON MODE CONTROL CIRCUITRY FOR MULTI-STAGE OPERATIONAL AMPLIFIERS

BACKGROUND

In general, in electronic circuits implementing a fully differential amplifier, a need exists for the fully differential amplifier to control common-mode voltage at its output. A typical approach includes using a common mode feedback (CMFB) amplifier. A CMFB amplifier can provide control of the common mode voltage at different nodes that cannot be stabilized by negative differential feedback, where a reference voltage may be provided that can provide a maximum differential voltage gain and/or maximum output voltage swing. The CMFB amplifier can also provide suppression of common mode components that tend to saturate different stages, by applying common mode negative feedback.

A CMFB amplifier senses the common-mode voltage or $V_A$ at the output; compares $V_A$ with a reference voltage or $V_{ref}$, and uses a control voltage $V_{cntrl}$ to control voltage of an internal biasing node of the CMFB amplifier, and provides feedback regulation. In a typical Miller operational amplifier (Op Amp), the internal biasing node is in the active load of a first stage.

The CMFB amplifier circuit may be realized with continuous-time or switched-capacitor structures. Such structures should have a speed performance comparable to the unity-gain frequency of the differential path, otherwise noise from power supplies could be significantly amplified (i.e., power supply rejection would be too small). In a conventional CMFB amplifier, this is usually difficult, since the CMFB amplifier may rely for stability on the differential path compensation. For example, the CMFB path in a Miller amplifier has an additional pole with respect to the differential one which is located at the control node, and the CMFB bandwidth will necessarily be smaller than the differential bandwidth. Depending on the circuit, the bandwidth may be up to two or three times smaller.

Additionally, in structures that do not rely only on Miller compensation, such as multistage amplifiers without Miller compensation, the conventional CMFB amplifier cannot be fully stabilized using the compensation of the differential path.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

Overview

The disclosure is directed to techniques for controlling common mode (CM) voltage of fully differential amplifiers. The techniques and concepts that are disclosed can be applied to fully differential amplifiers to provide a stable CM regulation. In particular, the disclosed techniques may be applied when relatively high bandwidth CM regulation is desired, since there is no dependence on the fully differential amplifier bandwidth. The techniques can be used together with different kinds of compensation techniques, and are not limited with use only with Miller compensated amplifiers. Different compensation techniques include techniques where the classic common mode feedback (CMFB) amplifier circuit cannot be used, for example, multistage amplifiers and conditionally stable amplifiers.

Exemplary System

Figure 1:
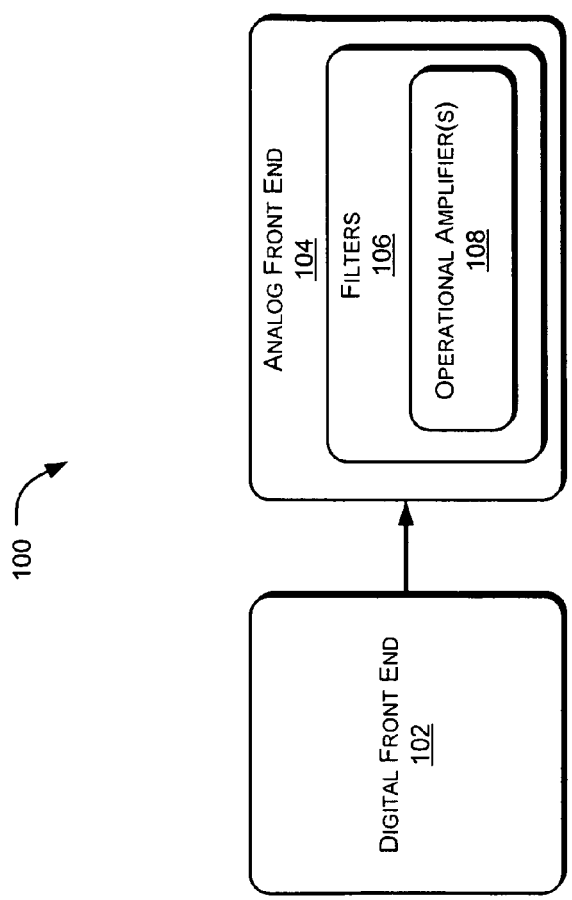
FIG. 1 is a block diagram illustrating an exemplary device for implementing fully differential amplifiers that provided a stable common mode (CM) regulation.

FIG. 1 illustrates an exemplary device 100 for implementing fully differential amplifiers that provided a stable common mode (CM) regulation. System or device 100 may be one of various electronic devices, such as a communication device (e.g., cellular telephone). Device 100 may include other components that are not shown in FIG. 1, such as processors), memory(ies), and various interfaces (e.g., intra system busses, antennae, etc.)

In the example, device 100 includes a digital front end 102 that communicates with an analog front end 104. The analog front end 104 may be a digital to analog converter (DAC) or include a DAC, when referring to a transmit path. The analog front end 104 can include connective filters or filters 106. The filters 106 may further include operational amplifier(s) or Op Amps 108, which are fully differential Op Amps, and may apply to a receive path. The Op Amps 108 are further discussed below. Device 100 is an exemplary implementation of Op Amps 108. It is contemplated that other implementations can make use of the techniques and methods describing Op Amps 108 and the concepts discussed below.

Exemplary Amplifier

Figure 2:
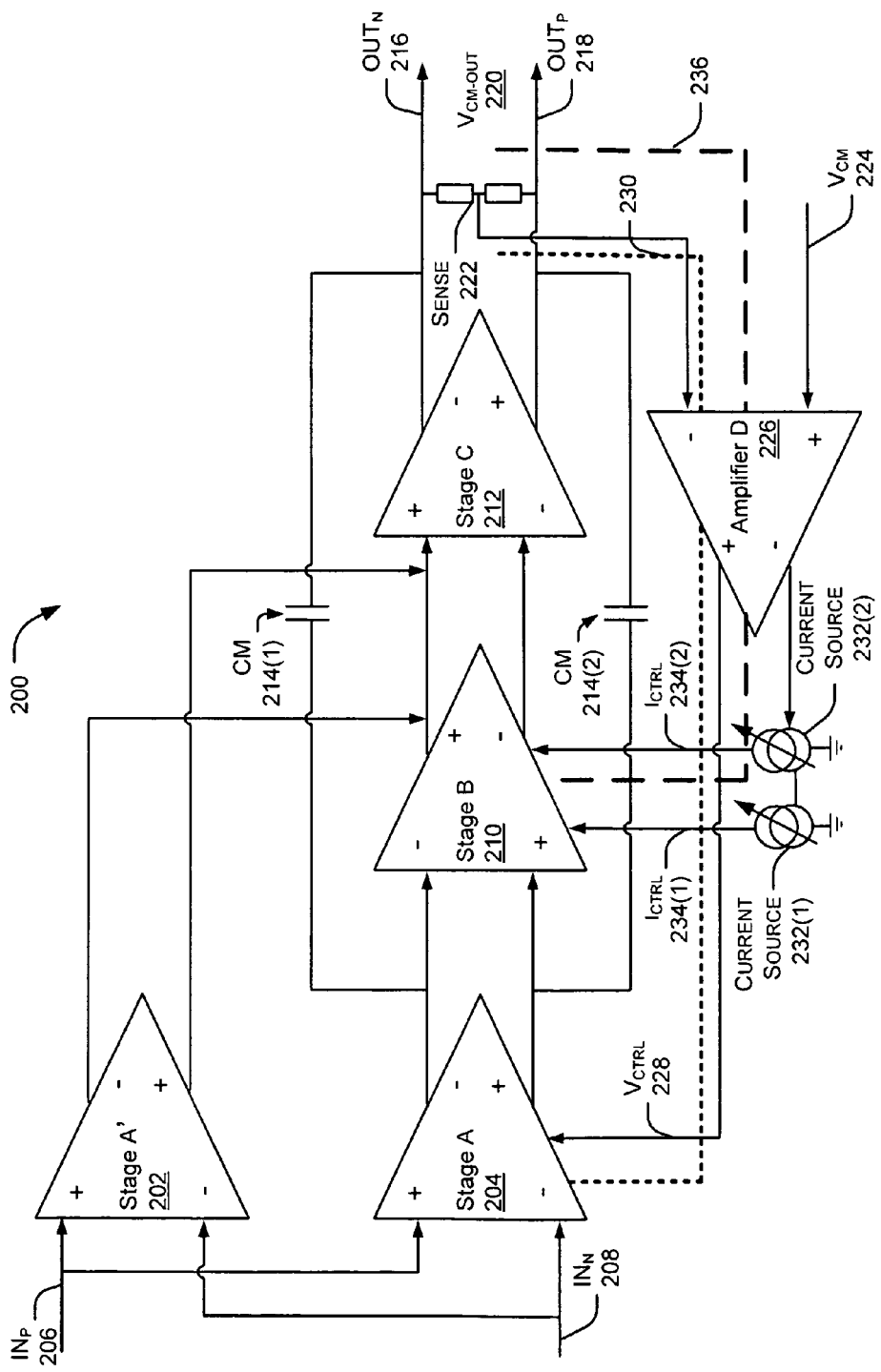
FIG. 2 is a block diagram illustrating an exemplary three-stage fully differential amplifier using common mode regulation.

FIG. 2 illustrates an exemplary differential amplifier or amplifier 200. Amplifier 200 may be an implementation of Op Amps 108 described above. The amplifier 200 implements common mode voltage regulation that uses feed back and feed forward regulation paths. As further discussed below, the feed back path may function like a traditional CMFB amplifier, with its bandwidth related to the differential path compensation. If Miller compensation is implemented for the amplifier 200, or for one of the stages of amplifier 200, this part of the circuit of amplifier 200, provides the common-mode regulation for the low-mid frequency range, with a bandwidth limited by the differential path compensation.

As further discussed below, the common mode feed forward path senses an output common-mode voltage and compares it with a reference voltage in order to inject a common-mode current in an amplification stage of amplifier 200. This provides common mode regulation. Having a zero in its transfer function, the common mode feed forward path provides common mode voltage regulation in the high frequency range.

The combination of the two feed back and feed forward paths can provide a very stable and wide band regulation, by placing the zero of the feed forward path in such a way that it compensates the non dominant pole of the feed back path. Furthermore, such an implementation provides that bandwidth of the common mode voltage regulation is not fully linked to the differential path bandwidth, and the bandwidth of the common mode voltage regulation can be enlarged, by increasing the power of the feed forward path.

Amplifier 200 may be implemented as a relatively high speed Op Amp, and particularly Op Amp(s) that do not use simple Miller compensation, such as three (or more) stage amplifiers. In general, an amplifier or stage may be needed for each of the feed back and feed forward paths of the common mode regulation; however, provided that the two paths do not act on the same stage, a single amplifier can be used.

Amplifier 200 is described as a three stage amplifier; however, it is to be appreciated that the concepts discussed may apply to amplifiers implementing various number of stages. Amplifier 200 has a first amplification stage that includes two amplifiers or stages A' 202 and A 204. Stage A' 202 and stage A 204 receive differential inputs $IN_N$ 206 and $IN_P$ 208. A second amplification stage, stage B 210, is coupled to the first amplification stage through stage A 204. A third amplification stage, stage C 212, is coupled to stage B 210.

Amplifier 200 is designed for high gain and uses a single Miller capacitor CM 214(1) and CM 214(2) to compensate the non dominant pole between the first stage A 204, and the third stage, stage C 212. A single Miller capacitor is used in reference to Miller compensation used to compensate one pole. The non dominant pole introduced by the second stage, stage B 210, is compensated with a zero introduced with a feed forward signal path by stage A' 202, as further discussed below.

When such a design is used for a fully differential structure, a conventional CMFB amplifier may not be used, since the single Miller capacitor CM 214 may not be enough to compensate the common-mode loop. While the CMFB amplifier shares poles with the differential path, having even one more at a control node, the CMFB amplifier is not influenced by the zero added with the feed forward signal path, and the common mode loop may only be partially compensated. Therefore, a feed forward path for the common mode helps to stabilize the common-mode loop, increasing its bandwidth to a value comparable to the differential path.

As discussed, stage A' 202 and stage A 204, which make up a first stage, stage B 210 that makes up a second stage, stage C 212 that makes up a third stage, are amplification stages of amplifier 200. A feed forward differential path is provided by stage A' 202 injecting a current signal(s) into the output of the second stage, stage B 210.

A non dominant pole introduced by C 212 is compensated with the Miller capacitor CM 214 introduced between the output of stage A 204 and the output of stage C 212. The non-dominant pole introduced by B 210 is compensated by the zero introduced by Stage A' 202.

Common mode control loop is described as follows. The amplifier 200 provides a differential voltage output shown as $OUT_N$ 216 and $OUT_P$ 218, and defined by common mode voltage $V_{CM-OUT}$ 220. The value of $V_{CM-OUT}$ 220 may be sensed, by summing resistive network or similar component, as represented by sense 222. The value of $V_{CM-OUT}$ 220 is compared with a reference voltage $V_{CM}$ 224 at an amplifier D 226.

One of the outputs of amplifier D 226, is used to feed back a control voltage $V_{CTRL}$ 228 into Stage A 204. This is the part of the amplifier 200, which acts as a conventional CMFB amplifier; the path is represented by line 230. In a differential stage, $V_{CTRL}$ 228 controls the biasing of the active load.

The other output of amplifier D is used to control two current sources 232(1) and 232(2), which inject a feed forward common-mode current(s) $I_{CTRL}$ 234(1) and $I_{CTRL}$ 234(2) into stage B 210; the path is represented by line 236. In practice, the two currents $I_{CTRL}$ 232(1) and $I_{CTRL}$ 232(2), which are the same current since controlled from a single node, change the biasing of the amplifying devices of the second stage, Stage B 210.

Combining the two paths represented by lines 230 and 236, so that the zero introduced by the feed-forward also partially compensates the non dominant pole of stage B 210, resulting in a fully stable complete common-mode loop transfer function. Furthermore, it is possible to increase the bandwidth of the common-mode regulation loop, by increasing power in the feed-forward path (as represented by line 236).

Figure 3:
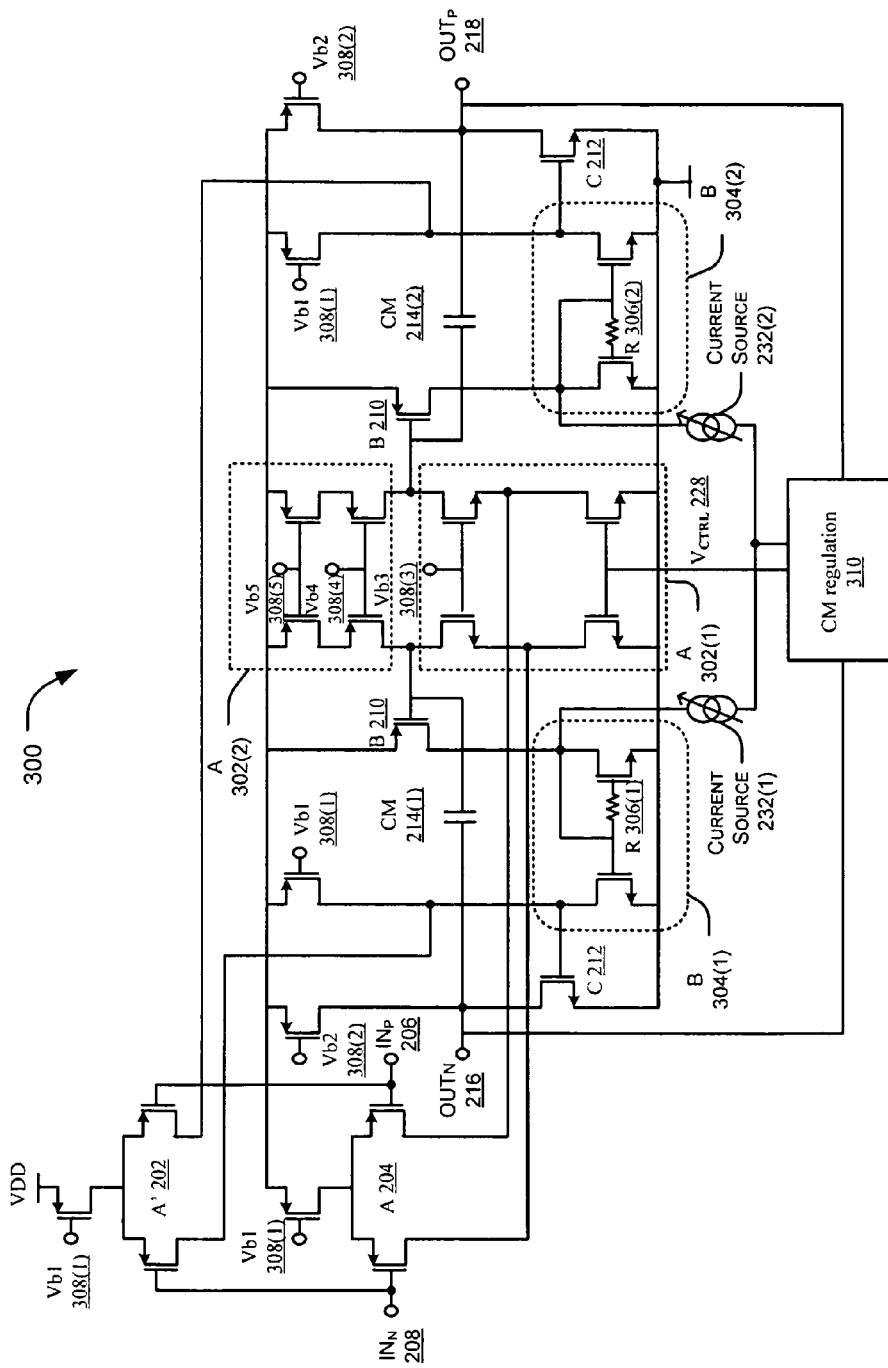
FIG. 3 is a circuit diagram of an exemplary three-stage fully differential amplifier using the invented common mode regulation.

FIG. 3 illustrates an exemplary circuit 300 of a fully differential three stage amplifier. As an example, the circuit 300 may be implemented using 65 nm CMOS technology with a one volt power supply. Circuit layout 300 is an exemplary implementation of amplifier 200. It is to be appreciated, that other implementations or configurations are possible, using different discrete components and/or arrangement of such components. Corresponding stages (amplifiers) and components are particularly identified by similar numerals identifying components (elements) in FIG. 3, as shown and discussed in reference to FIG. 2.

The first stage of the differential amplifier circuit 300, corresponding to stage A 204, is a folded cascode with a pMOS input differential pair, a cascode pair A 302(1) (as identified by the dotted line) and an active load A 302(2) (as identified by the dotted line). The stage A 204 provides a high gain, helping to create a dominant-pole system.

The second stage is done with a pMOS in common source configuration corresponding to stage B 210. A simple current mirror(s) B 304(1) and B 304(2) provides necessary phase inversion. Moreover, a compensation resistor(s) R 306(1) and R 306(2) is connected to the gate of the reference side of this current mirror(s) B 304 to enhance speed and bandwidth. The feed-forward differential path is a pMOS differential pair which provides the high frequency signal path from the OpAmp inputs $IN_P$ 206 and $IN_N$ 208 to the output of the second stage (B 210), corresponding to A' 202 in FIG. 2. Therefore, no compensation capacitance is needed for the second stage.

CM 214 is the Miller capacitor, connected between the output of A 204 and the output of the third stage (stage C). The third stage C 212, is a nMOS in common source configuration. Biasing voltages are identified by Vb1 308(1), Vb2 308(2), Vb3 308(3), Vb4 308(4), and Vb5 308(5).

Common mode (CM) regulation block 310 includes summing resistive network or sense 222 and amplifier D 226. For CM regulation, common-mode voltage is sensed between $OUT_N$ 216 and $OUT_P$ 218 and compared with the reference $V_{CM}$ 224 at amplifier D 226. The feed back path injects the control signal $V_{CTRL}$ 228 into the folded cascode of the first stage, and provides a negative feed back. The feed forward path which provides a pole-zero cancellation, injects a common-mode current 234(1) and 234(2) into the second stage B 210, regulating the common-mode voltage by acting on the biasing of this amplification stage.

Exemplary Methods

The order in which the methods below are described is not intended to be construed as a limitation, and any number of the described method blocks can be combined in any order to implement the methods, or an alternate method. Additionally, individual blocks may be deleted from the methods without departing from the spirit and scope of the subject matter described herein.

The methods introduced may, but need not, be implemented at least partially in architecture(s) such as shown in FIGS. 1 to 3. In addition, it is to be appreciated that certain acts in the methods need not be performed in the order described, may be modified, and/or may be omitted entirely. Furthermore, the methods can be implemented in any suitable hardware, firmware, or a combination thereof, without departing from the scope of the invention.

Figure 4:
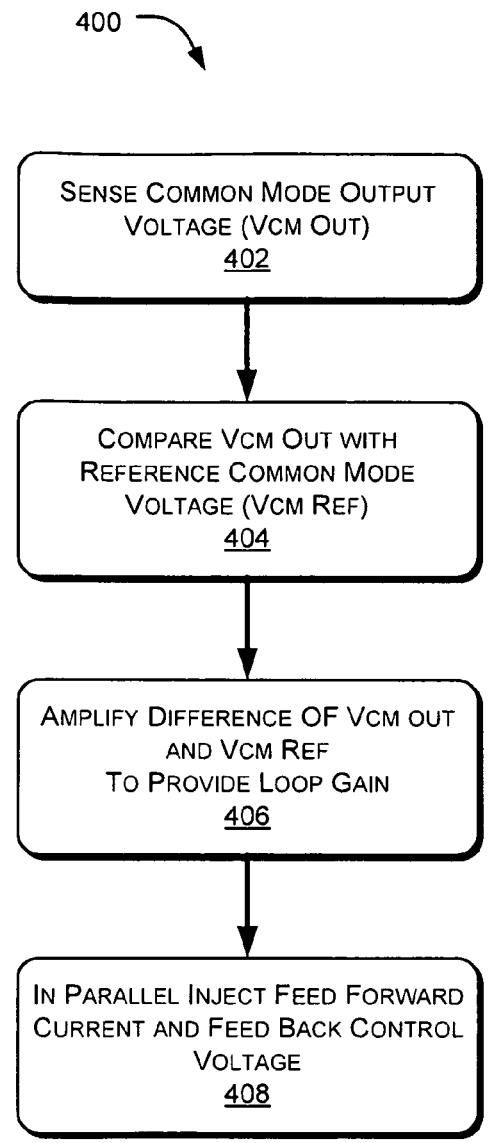
FIG. 4 is a flowchart illustrating an exemplary method for common mode regulation in multistage fully differential amplifiers.

FIG. 4 is a flowchart 400 illustrating an exemplary method for common mode regulation in multistage fully differential amplifiers.

At block 402, an output voltage is sensed at a multistage fully differential amplifier. The sensed output voltage, $V_{CM}$ Out, is sensed at an output final stage of the multistage differential amplifier. The sensed output voltage, $V_{CM}$ Out, is representative of the output common mode voltage of the multistage amplifier. In the discussion above, $V_{CM}$ Out is described as $V_{CM-OUT}$ 220. As discussed above, this sensing may be performed by one of various circuits, such as a summing resistive network.

At block 404, comparison is made as to the sensed output voltage, $V_{CM}$ Out, and a common mode reference voltage, $V_{CM}$ Ref. The comparison may be made by an amplifier, such as amplifier D 226 as discussed above.

At block 406, the difference between $V_{CM}$ Out and $V_{CM}$ Ref, as performed in block 404 is amplified. This amplified difference provides a loop gain for the common mode signal.

At block 408, a feed forward current is injected to a stage of the multistage amplifier, and in parallel a feed back control voltage is provided to another stage. As discussed above the feed forward current is used to change biasing of an intermediate amplifier or amplification stage. The feed back control voltage changes the biasing of an active load of an initial or first stage, performing as a conventional common mode feedback (CMFB) amplifier.

CONCLUSION

For the purposes of this disclosure and the claims that follow, the terms "coupled" has been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. For example, the systems described could be configured as monitoring circuits and incorporated into various feedback and control loops. In addition, the voltage regulation circuit may include other types of devices and amplifiers in various analog and digital configurations.

What is claimed is:

1. A fully differential amplifier comprising:
    a first amplification stage;
    a second amplification stage coupled to the first amplification stage, wherein a feed forward path is provided by injecting a current signal to the output of the second amplification stage;
    a third amplification stage coupled to the second amplification stage, having a non dominant pole that is compensated by a single Miller capacitor; and
    a common mode amplifier that provides an output to control a current source that injects a control current into the second amplification stage.

2. The fully differential amplifier of claim 1, wherein the first amplification stage is comprised of two stages.

3. The fully differential amplifier of claim 1, wherein the first amplification stage provides a high gain that creates a dominant pole system.

4. The fully differential amplifier of claim 1, wherein the first amplification stage includes a folded cascade.

5. The fully differential amplifier of claim 1, wherein the third amplification stage provides a differential output of the fully differential amplifier.

6. The fully differential amplifier of claim 1, wherein a voltage of a differential output is sensed and compared with a reference voltage, the difference of the voltage of the differential output and the reference voltage is amplified to provide a loop gain for a common mode signal.

7. A method for common mode regulation in a fully differential amplifier comprising:
    sensing an output voltage of the fully differential amplifier;
    comparing the output voltage to a reference voltage;
    determining the difference of the output voltage and the reference voltage;
    amplifying the difference to provide loop gain for a common mode signal;
    injecting a feed forward current based on the loop gain, to one stage of the fully differential amplifier; and
    providing a feed back control voltage to another stage, in parallel to the injecting, the feed back control voltage to change a biasing of an active load of the another stage.

8. The method of claim 7, wherein the output voltage is representative of a common mode output voltage of the fully differential amplifier.

9. The method of claim 7, wherein the sensing is performed by a summing resistive network.

10. The method of claim 7, wherein the determining and amplifying is performed by a common mode amplifier.

11. The method of claim 7, wherein the feed forward current changes biasing of the second stage.

* * * * *